United States Patent
Onuma et al.

(10) Patent No.: US 8,530,949 B2
(45) Date of Patent: Sep. 10, 2013

(54) SEMICONDUCTOR DEVICE WITH COMMON CONTACT COUPLING GATE WIRING INTEGRATED WITH GATE ELECTRODE OF ANTIFUSE TO DIFFUSION LAYER

(75) Inventors: Takuji Onuma, Kanagawa (JP); Kenichi Hidaka, Kanagawa (JP); Hiromichi Takaoka, Kanagawa (JP); Yoshitaka Kubota, Kanagawa (JP); Hiroshi Tsuda, Kanagawa (JP); Kiyokazu Ishige, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/250,516

(22) Filed: Sep. 30, 2011

(65) Prior Publication Data
US 2012/0080736 A1    Apr. 5, 2012

(30) Foreign Application Priority Data

Oct. 1, 2010    (JP) ................. 2010-224193

(51) Int. Cl.
*H01L 29/76* (2006.01)
*H01L 29/78* (2006.01)

(52) U.S. Cl.
USPC ........... 257/314; 257/104; 257/107; 257/530; 257/E29.255

(58) Field of Classification Search
CPC ............ H01L 23/5252; H01L 27/0207; H01L 27/11206; G11C 17/00; G11C 17/16
USPC ........... 257/50, 188, 528, E23.147, E23.149, 257/288, 529, 530
See application file for complete search history.

(56) References Cited

U.S. PATENT DOCUMENTS

| | | | | |
|---|---|---|---|---|
| 5,652,452 | A | * | 7/1997 | Asano ............................. 257/341 |
| 6,812,542 | B2 | * | 11/2004 | Kohyama ....................... 257/530 |
| 6,897,543 | B1 | * | 5/2005 | Huang et al. ................... 257/530 |
| 6,992,925 | B2 | | 1/2006 | Peng |
| 7,601,564 | B2 | * | 10/2009 | Okayama ....................... 438/131 |
| 2009/0057735 | A1 | * | 3/2009 | Beak et al. ..................... 257/292 |
| 2009/0115021 | A1 | * | 5/2009 | Moriwaki ....................... 257/530 |
| 2011/0122672 | A1 | | 5/2011 | Kodama et al. |

FOREIGN PATENT DOCUMENTS

JP    4410101 B2    11/2009
JP    2009-290189 A    12/2009

OTHER PUBLICATIONS

Greg Uhlmann et al., A Commercial FPD eFuse Array.*
Greg Uhlmann et al., "A Commercial Field-Programmable Dense eFuse Array Memory with 99.999% Sense Yield for 45nm SOI CMOS," 2008 IEEE International Solid-State Circuits Conference; Digest of Technical Papers; Feb. 2008; pp. 406-407.

* cited by examiner

*Primary Examiner* — Ha Tran T Nguyen
*Assistant Examiner* — Thai T Vuong
(74) *Attorney, Agent, or Firm* — Sughrue Mion, PLLC

(57) ABSTRACT

An antifuse whose internal written information cannot be analyzed even by utilizing methods to determine whether there is a charge-up in the electrodes. The antifuse includes a gate insulation film, a gate electrode, and a first diffusion layer. A second diffusion layer is isolated from the first diffusion layer by way of a device isolator film, and is the same conduction type as the first diffusion layer. The gate wiring is formed as one integrated piece with the gate electrode, and extends over the device isolator film. A common contact couples the gate wiring to the second diffusion layer. The gate electrode is comprised of semiconductor material such as polysilicon that is doped with impurities of the same conduction type as the first diffusion layer. The second diffusion layer is coupled only to the common contact.

10 Claims, 7 Drawing Sheets

SEMICONDUCTOR DEVICE WITH COMMON CONTACT COUPLING GATE WIRING INTEGRATED WITH GATE ELECTRODE OF ANTIFUSE TO DIFFUSION LAYER

CROSS-REFERENCE TO RELATED APPLICATIONS

The disclosure of Japanese Patent Application No. 2010-224193 filed on Oct. 1, 2010 including the specification, drawings and abstract is incorporated herein by reference in its entirety.

BACKGROUND

The present invention relates to a semiconductor device including an antifuse as the memory device.

One type of memory device is the nonvolatile memory (OTP: One Time Programmable Device) which is incapable of being rewritten. The OTP device is typically known as a memory device type with an electrically conductive path (fuse) made from the same material as the gate electrode (e.g. polysilicon) or the same material as the wiring (e.g. copper or aluminum) and that breaks due to melting or electromigration.

In recent years, demands have been made for an OPT device whose internal written information is difficult to analyze. Memory device types containing a fuse that breaks or blows have the problem that methods such as image processing can easily analyze whether the fuse is broken so that the information written in the device can be analyzed, as for example described in Greg Uhlmann and others, "A Commercial Field-Programmable Dense eFUSE Array Memory with 99.999% Sense Yield for 45 nm SOI CMOS," 2008 IEEE INTERNATIONAL SOLID-STATE CIRCUITS CONFERENCE, SESSION 22, 22.4.

Antifuse type memory devices are being developed as OTP devices in recent years. These antifuse type memory devices (see for example Japanese Patent No. 4410101 and Japanese Unexamined Patent Publication No. 2009-290189) write information by applying a voltage higher than the breakdown voltage to the insulator (dielectric) film such as the gate insulator film or MIM capacitor to destroy the insulation. Analysis such as by image processing is impossible in antifuse type memory devices whose gate insulator film was destroyed after setting the appropriate conditions for destroying the film.

SUMMARY

Even on antifuse type memory devices however, techniques such as voltage contrast methods can be utilized to analyze the presence of a charge-up on the electrode (e.g. gate electrode) to analyze the information written in the device. The reason these antifuse type memory devices can be analyzed and their information read is as follows. If the insulator film (such as the gate insulator film) has not been destroyed, when electrical charges are then irradiated into the wire coupled to the electrode, those electrical charges accumulate on the electrode. However if the insulator film has been destroyed then electrical charges irradiated into the wire coupled to the electrode flee by way of the insulator film to the underlayer (e.g. substrate). Therefore utilizing techniques that analyze whether there is a charge-up on the electrode, allow analyzing the information written in the memory device.

According to an aspect of the present invention, there is provided a semiconductor device including an antifuse comprised of a gate insulation film, a gate electrode, and first diffusion layer; a second diffusion layer of the same conduction type as the first diffusion layer and isolated from the first diffusion layer by way of a device isolator film; a gate wiring that is one integrated piece with the gate electrode and extends over the device isolator film; and a common contact that couples the gate wiring to the second diffusion layer, and in which the second diffusion layer is coupled only to the common contact.

Writing information in the antifuse causes destruction of the insulation in the gate insulation film. The gate electrode of the antifuse is therefore coupled to the substrate. In other words, a gate electrode of the same semiconductor conduction type as the first diffusion layer, functions as a diode relative to the substrate when information has been written into the antifuse. However in the present invention, the gate electrode of the antifuse is coupled by way of a gate wiring and a common contact to a second diffusion layer. The gate electrode of the antifuse is in other words constantly configured as a diode relative to the substrate by way of the gate wiring, common contact, and second diffusion layer. The second diffusion layer is the same conduction type as the first diffusion layer. Therefore, if limited to techniques for analyzing whether there is a charge-up over the electrode (e.g. gate electrode), then the structure of the present invention will constantly appear in the same state as when the antifuse is written with information. This invention can therefore provide a semiconductor device whose written information cannot be analyzed even by using techniques for analyzing whether there is a charge-up in the electrode.

If the second diffusion layer is coupled to other wiring, then the gate electrode of that antifuse is coupled to that other wiring by way of the common contact and the second diffusion layer. In such cases, there is a possibility that the gate insulation film of the antifuse might not be destroyed even if a voltage is applied to the antifuse to write information. However in the present invention the second diffusion layer is coupled only to the common contact so the semiconductor device is in a floating state. The structure of the present invention therefore suppresses writing defects from occurring in the antifuse even if a common contact and second diffusion layer have been provided.

The present invention therefore provides a semiconductor device whose written information cannot be analyzed even by using techniques for analyzing whether there is a charge-up in the electrode.

DETAILED DESCRIPTION

Figure 1:
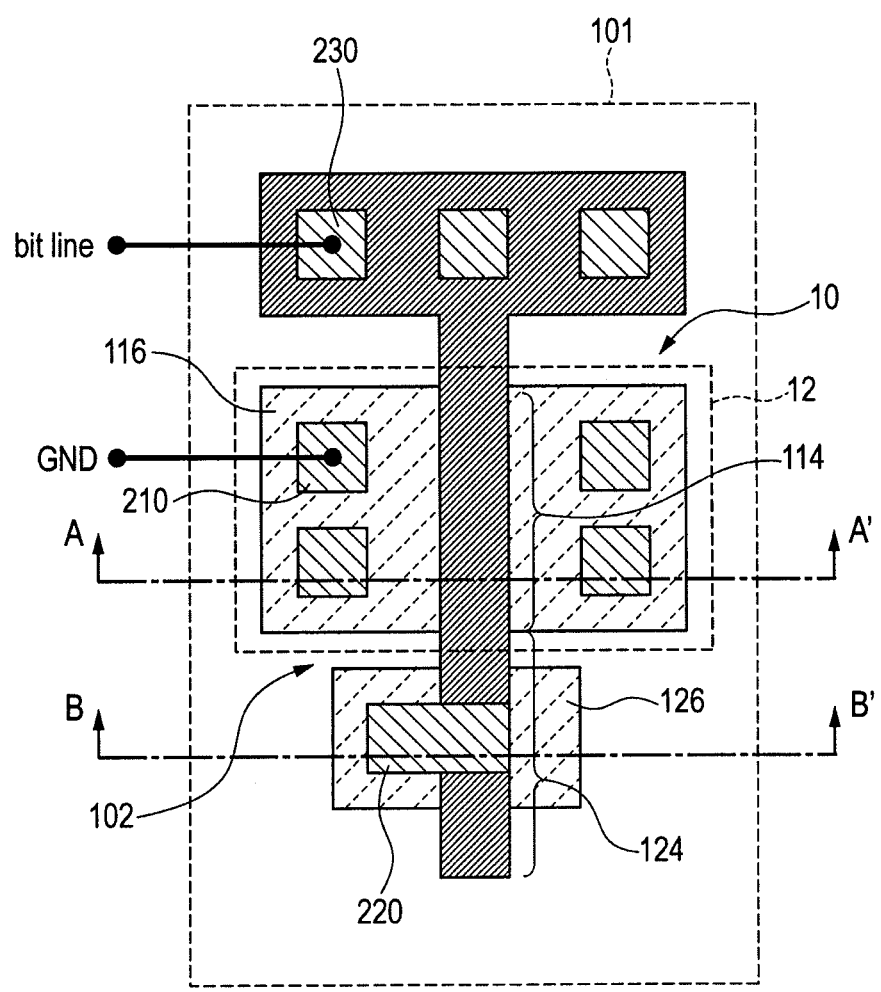
FIG. 1 is a plan view showing the structure of the semiconductor device of a first embodiment.

The embodiments of the present invention are described next while referring to the drawings. In all of the drawings, the same structural elements are assigned the same reference numerals and redundant descriptions are omitted.

First Embodiment

Figure 2:
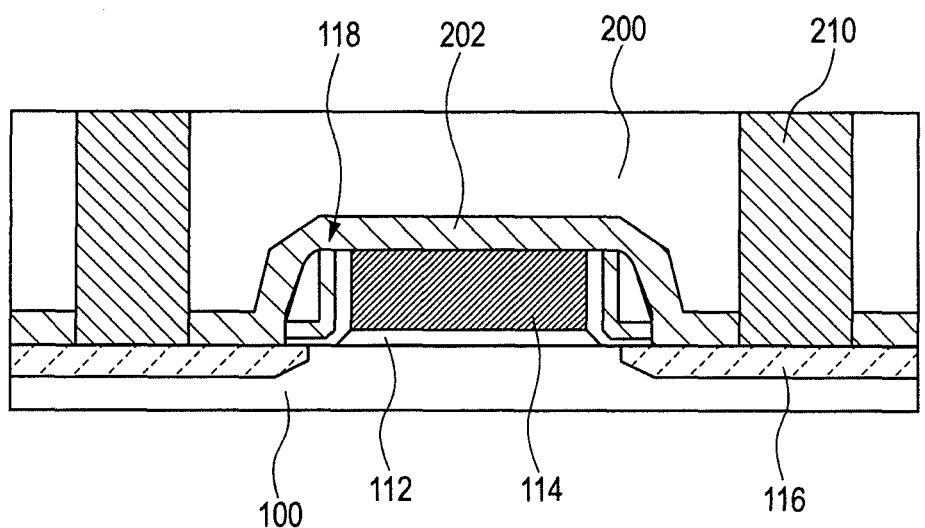
FIG. 2 is a drawing showing a fragment of the cross-sectional view taken along the lines A-A' in FIG. 1.
Figure 3:
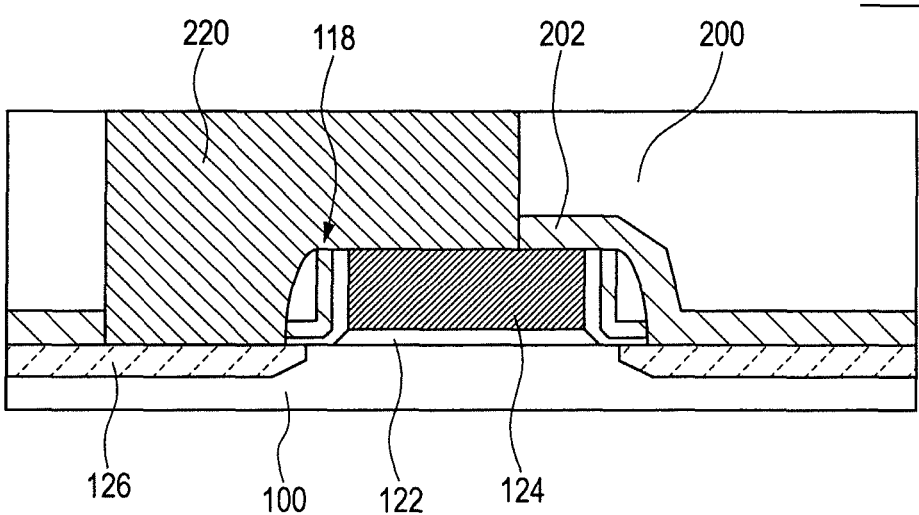
FIG. 3 is a drawing showing a fragment of the cross-sectional view taken along the lines B-B' in FIG. 1.

FIG. 1 is a plan view showing the structure of the semiconductor device of the first embodiment. FIG. 2 is a drawing showing a fragment of the cross-sectional view taken along the lines A-A' in FIG. 1. FIG. 3 is a drawing showing a fragment of the cross-sectional view taken along the lines B-B' in FIG. 1. The semiconductor device of this embodiment includes a memory device 10 as shown in FIG. 1. The memory device 10 is comprised of an antifuse 12, a second diffusion layer 126, a gate wiring 124, and a common contact 220. The antifuse 12 is comprised of a gate insulation film 12 (shown in FIG. 2), a gate electrode 114, and a first diffusion layer 116. The second diffusion layer 126 is isolated from the first diffusion layer 116 by way of the device isolator film 102 and is the same conduction type as the first diffusion layer 116. The gate wiring 124 is integrated as one piece with the gate electrode 114, and extends over the device isolation film 102. The common contact 220 couples the gate wiring 124 to the second diffusion layer 126. The gate electrode 114 is a semiconductor injected (doped) with impurities of the same conduction type as the first diffusion layer 116 such as polysilicon. The second diffusion layer 126 is coupled only to the common contact 220. The invention is described next in more detail.

The semiconductor device of the present embodiment is comprised of a semiconductor substrate 100 utilizing for example a silicon substrate. The antifuse 12 is comprised for example of the same structure as a MOS transistor or a MOS capacitor, including a gate electrode 114 laminated over the gate insulation film 112, and further a first gate diffusion layer 116 at both sides of the gate electrode 114 as seen from a plan view. The gate insulation film 112 is for example a film of silicon oxide with a film thickness for example of 3 nm or less. The first diffusion film 116 is for example the N conduction type. The region on the semiconductor substrate 100 including at least the antifuse 12 and the second diffusion layer 126 is a conduction type opposite the first diffusion layer 116 such as P type conduction. In this embodiment, an inverse conduction type well 101 that conducts opposite the first diffusion layer 116 is formed over the semiconductor device 100. A ground voltage potential is applied to both the first diffusion layers 116 by way of the contact 210. The antifuse 12 however is not limited to the above described structure. The first diffusion layer 116 may be a P conduction type and the well 101 may be an N conduction type. In such cases, a power supply voltage is applied to the contact 210.

The gate electrode 114 is formed as a structure integrated with the gate wiring 124. The gate electrode 114 and the gate wiring 124 are comprised for example from polysilicon and contain the same impurities as the first diffusion layer 116 and the second diffusion layer 126. The gate electrode 114 and the gate wiring 124 are therefore the same conduction type as the first diffusion layer 116 and the second diffusion layer 126. The gate electrode 114 and the gate wiring 124 are coupled to the bit lines by way of the contact 230. The bit lines are coupled to the control transistor (not shown in drawing) for the antifuse 12.

The device isolation film 102 isolates the second diffusion layer forming region that forms the second diffusion layer 126, from the other regions. A dummy gate insulation film 122 (shown in FIG. 3) is formed in this second diffusion layer forming region. The gate wiring 124 is formed via the device isolation film 102 and extends above the semiconductor device 100 positioned in the second diffusion layer forming region by way of the dummy gate insulation film 122. In other words, the second diffusion layer 126 and the gate wiring 124 in this embodiment are comprised of the same structure as a MOS transistor or a MOS capacitor. The dummy gate insulation film 122 in this embodiment is formed in a process identical to that for the gate insulation film 112, and is the same thickness as the gate insulation film 112. The second diffusion layer 126 is fabricated in a process identical to that for the first diffusion layer 116. The common contact 102 is coupled simultaneously to the gate wiring 124 and the second diffusion layer 126. The gate wiring 124 is in other words shorted to the second diffusion layer 126 by way of the common contact 220. Besides forming a diode on the substrate 100 or the well 110, the second diffusion layer 126 is coupled only to the common contact 220, and is not electrically coupled elsewhere. In the example shown in this drawing, the common contact 220 is coupled only to one of the second diffusion layers 126 without spanning the gate wiring 124; however, the common contact 220 may be coupled to both of the second diffusion layers 126 while spanning the gate wiring 124. Moreover, the second diffusion layer 126 may be fabricated so as to adjoin only one of the side surfaces of the gate wiring 124.

The sidewall 118 (shown in FIG. 2, FIG. 3) is fabricated on the side walls of the gate electrode 114 and the gate wiring 124. The sidewall 118 is fabricated by laminations formed from the bottom upwards in the order of silicon oxide film, silicon nitride film, and silicon oxide film. The composition of this sidewall 118 however is not limited to the example shown in this drawing.

The contacts 210, 230, and the common contact 220 are made from a conductive element such as tungsten embedded in the interlayer dielectric film 200. An etching stopper film 202 is formed below this interlayer dielectric film 200. The contacts 210, 230, and the common contact 220 pass through the interlayer dielectric film 200 and the etching stopper film 202. Connecting holes must be formed in the interlayer dielectric film 200 by etching in order to embed the contacts 210, 230, and the common contact 220 in the interlayer dielectric film 200. The etching stopper film 202 functions as an etching stopper when forming the connecting holes in the interlayer dielectric film 200. The interlayer dielectric film 200 is a film comprised of silicon oxide as the main element, and the etching stopper film 202 is a silicon nitride film.

Figure 5:
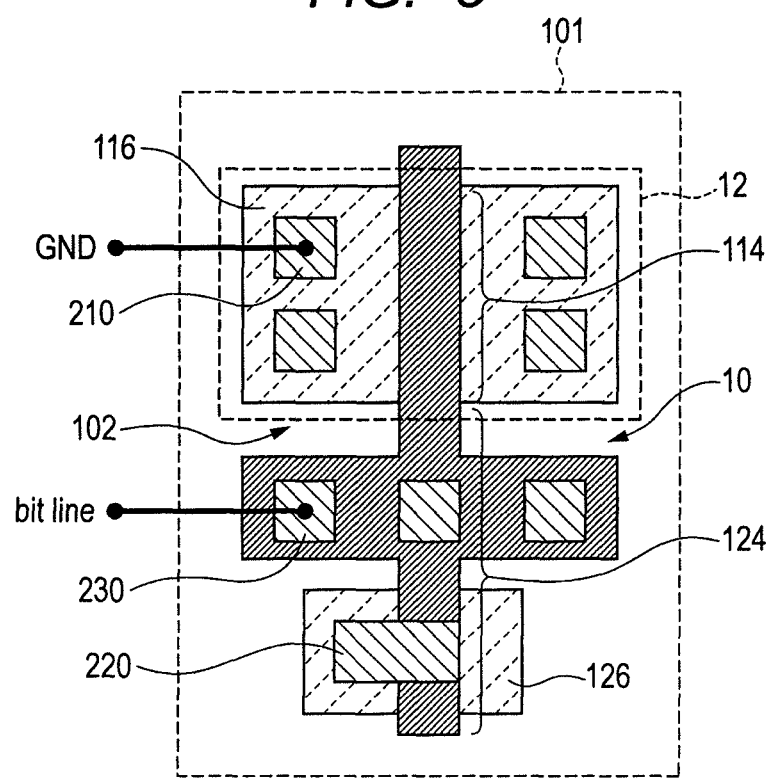
FIG. 5 is a plan view showing a modification of FIG. 1.

In the example shown in FIG. 1, the contact 230, antifuse 12, and the second diffusion layer 126 are arrayed in that sequence when viewed from the direction that the gate electrode 114 extends, however the present invention is not limited to the sequence shown in this example. The antifuse 12, the contact 230, and the second diffusion layer 126 may for example be arrayed in the sequence shown in FIG. 5.

Figure 4:
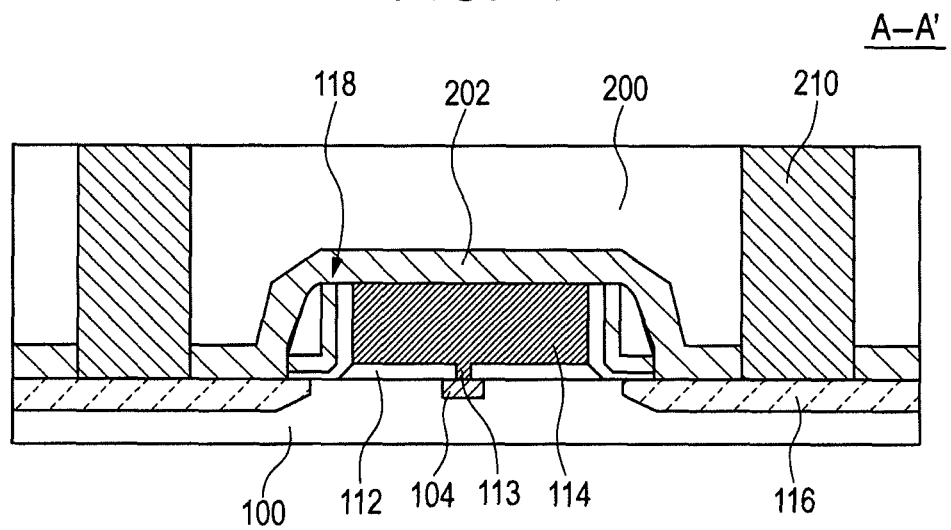
FIG. 4 is a cross-sectional view taken along the lines A-A' showing the state after writing in the antifuse.

The function and the effect of the present embodiment are described next while referring to FIG. 1 through FIG. 4. FIG. 4 is a cross-sectional drawing taken along lines A-A' showing the state of the antifuse 12 after writing in the antifuse 12 was performed. Results from a study made by the present inventors showed that when insulation was destroyed in a portion 113 of the gate insulation film 112 after writing in the antifuse 12, then an impurity (doped) region 104 of the same conduction type as the gate electrode 114 and first diffusion layer 116, or in other words a conduction type opposite that of the semiconductor substrate 100, was formed over the semiconductor substrate 100 at a position below this portion 113. This impurity region 104 and semiconductor substrate 100 form a diode. An impurity region 104 might not be formed even if writing was performed in the antifuse 12, however even in this case a diode will be formed by the gate electrode 114 and the semiconductor substrate 100.

In a typical antifuse type memory device one can therefore determine whether writing was performed in the antifuse 12 by whether or not negative charges have accumulated on the gate electrode 114 when the impurity region 104 is the N type and the semiconductor substrate 100 is the P type. Conversely, when the impurity region 104 is the P type and the semiconductor substrate 100 is the N type, then one can determine whether writing was performed in the antifuse 12 by the accumulation of a positive charge on the gate electrode 114.

In contrast, in the present embodiment the gate electrode 114 of the antifuse 12 is coupled by way of the gate wiring 124 and the common contact 220 to the second diffusion layer 126. The second diffusion layer 126 and the semiconductor substrate 100 form a diode however this diode is the same conduction type as the diode formed by the impurity region 104 and the semiconductor substrate 100. If utilizing techniques limited to the analyzing the presence of a charge-up in the gate electrode 114, then the structure described in this embodiment is constantly in the same state as when information was written in the antifuse. Information written on the antifuse cannot be analyzed by utilizing techniques to analyze whether there is a charge-up on the electrode.

If the second diffusion layer 126 here is coupled to wiring or a contact other than the common contact 220, then the gate electrode 114 of the antifuse 12 is coupled to other wiring by way of the common contact 220 and the second diffusion layer 126. In this case, there is the possibility that the insulation of the gate insulation film 112 of antifuse 12 will not be destroyed even if a voltage for writing on the antifuse 12 is applied. In contrast to the above, in the present embodiment the second diffusion layer 126 is coupled only to the common contact 220 and so is the same voltage potential as the gate wiring 124. Writing defects are therefore prevented from occurring on the antifuse 12 is therefore prevented even if there are a common contact 220 and the second diffusion layer 126.

The case where the thickness of the gate insulation film 112 and the dummy gate insulation film 122 is 2 nm is considered next. Applying 6.5 volts to the gate electrode 114 forms an inversion layer on the side section of the gate electrode 114 side among the first diffusion layer 116 and below the gate electrode 114. The first diffusion layer 116 is at ground potential so this inversion layer is also at ground voltage potential. Therefore, applying 6.5 volts to the gate insulation film 112 destroys the insulation of the gate insulation film 112. The same voltage applied to the gate electrode 114 is also applied to the gate wiring 124, however the second diffusion layer 126 is shorted to the gate wiring 124 by way of the common contact 220 so that the inversion layer formed below the gate wiring 124 is also at the same voltage potential as the gate wiring 124. Therefore, no voltage is applied to the dummy gate insulation film 122 and consequently the insulation in the dummy gate insulation film 122 is not destroyed. A voltage for example of approximately 1.8 volts is preferably applied when reading out information written in the antifuse 12. Compared for example to a current of approximately 50 μA that flows in an antifuse 12 where information is written, only about 1 nA of current flows in an antifuse 12 not written with information. Determining if there is writing in the antifuse 12 is therefore simple.

The process for forming the common contact 220 can utilize the same process as forming common contacts for example on an SRAM. The process for forming the common contact 220 can therefore utilize a manufacturing process with already established technology.

Second Embodiment

Figure 6:
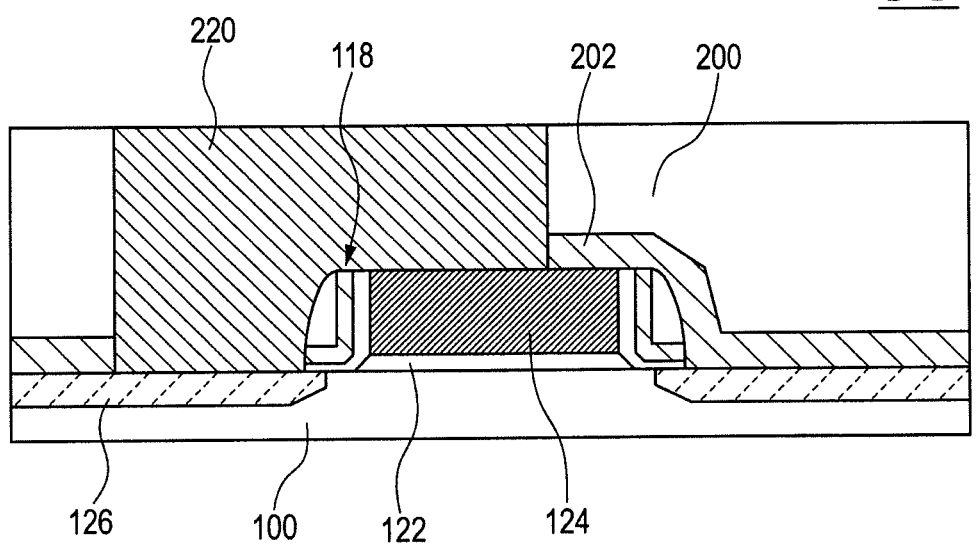
FIG. 6 is a cross-sectional view taken along the lines B-B' for describing the structure of the semiconductor device of a second embodiment.

FIG. 6 is a cross-sectional drawing for describing the structure of the semiconductor device of the second embodiment, and is equivalent to FIG. 3 in the first embodiment. The semiconductor device of this embodiment is identical to the structure in the first embodiment except for the point that the thickness of the dummy gate insulation film 122 is thicker than the gate insulation film 112. If the gate insulation film of the control transistor for the antifuse 12 for example is thicker than the gate insulation film 112 of the antifuse 12, then the dummy gate insulation film 122 can be formed in the same process as the gate insulation film of the control transistor. In such cases the dummy gate insulation film 122 attains the same thickness as the gate insulation film of the control transistor.

This embodiment can also render the same effects as the first embodiment. Moreover the thickness of the dummy gate insulation film 122 is greater than the thickness of the gate insulation film 112 so that destruction of the dummy gate insulation film 122 can be suppressed prior to that of the gate insulation film 122 when writing in the antifuse 12.

Third Embodiment

Figure 7:
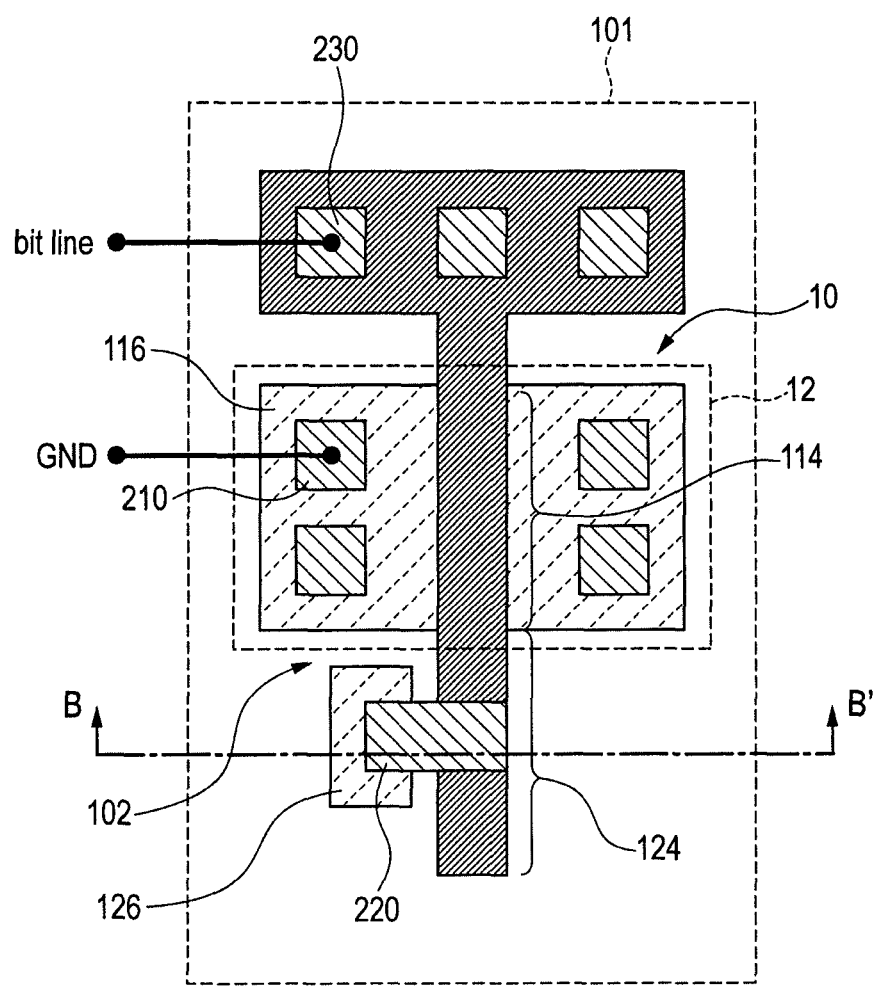
FIG. 7 is a plan view showing the structure of the semiconductor device of a third embodiment.
Figure 8:
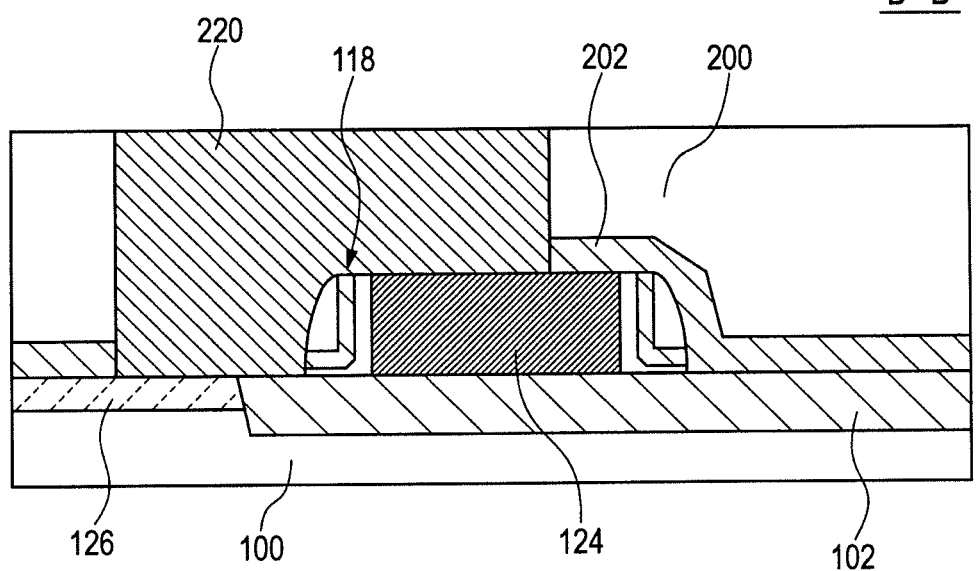
FIG. 8 is a drawing showing a fragment of the cross-sectional view taken along the lines B-B' in FIG. 7.

FIG. 7 is a plan view showing the structure of the semiconductor device of the third embodiment. FIG. 8 is a drawing showing a fragment of a cross-section taken along the lines B-B' in FIG. 7. The semiconductor device of the present embodiment is identical to the semiconductor device of the first embodiment except for the following points.

First of all, the gate wiring 124 extends over the device isolation film 102 but does not extend over the second diffusion layer forming region. In other words, when viewed from a plan view, the device isolation region 102 is positioned between the gate wiring 124 and the second diffusion layer 126. Moreover, there is no dummy gate insulation film 122 formed in the second diffusion layer forming region. The common contact 220 is in contact with the gate wiring 124, the device isolation region 102, and the second diffusion layer 126.

The embodiment also renders the effect that the written information cannot be analyzed, even by utilizing techniques to analyze whether there is a charge-up in the electrode for the same reason as in the first embodiment. Moreover, the gate wiring 124 does not extend over the second diffusion layer forming region and so writing defects in the antifuse 12 can be prevented from occurring even if there are a common contact 220 and a second diffusion layer 126.

The etching stopper film 202 moreover functions as an etching stopper when making connection holes in the interlayer dielectric film 200 for embedding the common contact 220. When forming the connection holes, the etching stopper film 202 is lastly removed by etching. The device isolation region 102 (e.g. silicon oxide film) here is sufficiently thick compared to the sidewall 118 in FIG. 6, so even if the device isolation film 102 is partially removed when making connection holes for embedding the common contact 220, the common contact 220 can be prevented from coupling to regions in the semiconductor substrate 100 where the second diffusion layer 126 is not formed and creating current leak points.

Fourth Embodiment

The semiconductor device of the present embodiment is identical to the semiconductor device of the first or second embodiment except for the following points.

In the present embodiment, at least the section of the gate wiring 124 positioned in the second diffusion layer forming region is an inverse conduction type opposite that of the second diffusion layer 126 and for example is the P conduction type. In other words in this embodiment, the gate wiring 124 and the second diffusion layer 126 are the same structure as buried channel type MOS transistors.

The present embodiment also renders the same effect as the first embodiment. Moreover, at least the section of the gate wiring 124 positioned in the second diffusion layer forming region is an inverse conduction type that conducts in a direction opposite the second diffusion layer 126. The inversion layer formed below the dummy gate insulation film 122 when a voltage is applied to the gate wiring 124 is therefore formed at a position that is comparatively deep compared to the first embodiment. Stated in other words, the gate wiring 124 is separated from the inversion layer somewhat further than in the first embodiment and so the dummy gate insulation film 122 is thick as regards electrical characteristics. Destruction of the dummy gate insulation film 122 can therefore be prevented prior to that of the gate insulation film 112 when writing onto the antifuse 12.

Fifth Embodiment

Figure 9:
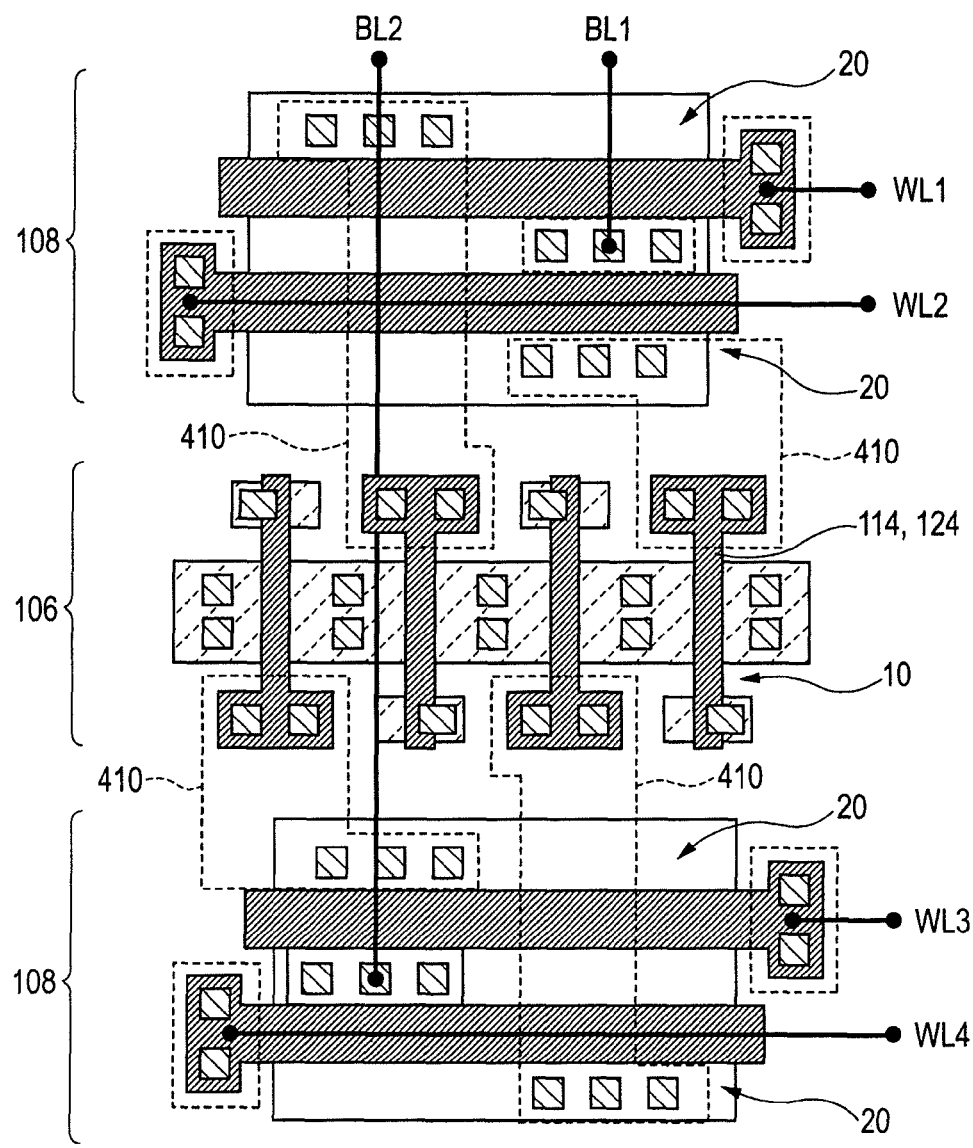
FIG. 9 is a plan view showing the structure of the semiconductor device of a fifth embodiment.

FIG. 9 is a plan view showing the structure of the semiconductor device of the fifth embodiment. The semiconductor device of the present embodiment contains multiple memory devices 10 shown in each of the first through the fourth embodiments. The control transistors 20 are provided separate in each of the multiple memory devices 10. These control transistors 20 may be the same conduction type as the antifuse 12 or may be an inverse conduction type.

More specifically, an antifuse forming region 106 is set in the semiconductor device as seen from a plan view. Only the above plural memory devices 10 are mutually positioned adjacent to each other in this antifuse forming region 106. There are no other devices formed between these memory devices 10.

The control transistors 20 are mounted together in a control transistor forming region 108 which is a region separate from the antifuse forming region 106. The control transistors 20 are coupled to the gate wiring 124 and the gate electrode 114 of the memory device 10 by way of the coupling line 410 formed using the upper wiring layer. The control transistor 20 may be the same conduction type as the antifuse 13 or may be an inverse conduction type. Moreover, if the antifuse 12 is the same structure as the first embodiment, then the thickness of the gate insulation film of the control transistor 20 is equivalent to the thickness of the dummy gate insulation film 122.

The present embodiment also renders the same effects as the first through the fourth embodiments. Moreover, a coupling line 410 to couple the gate electrode 114, the gate wiring 124, and the control transistor 20 is formed by utilizing a wiring layer in a higher layer than the gate electrode 114 and the gate wiring 124. The coupling line 410 can therefore be formed without worrying about the positions of the control transistors 20 and the memory devices 10 so that the semiconductor device can be made smaller.

The embodiments of the present invention were described while referring to the drawings however these embodiments are merely examples and structures other than described above may also be utilized.

What is claimed is:

1. A semiconductor device comprising:
   an antifuse including a gate insulation film, gate electrode, and a first diffusion layer;
   a second diffusion layer of the same conduction type as the first diffusion layer and isolated from the first diffusion layer by way of a device isolation film;
   a gate wiring formed integrated with the gate electrode and extending over the device isolation film; and
   a common contact coupling the gate wiring to the second diffusion layer,
   wherein the gate electrode is comprised of a semiconductor injected with impurities of the same conduction type as the first diffusion layer, and the second diffusion layer is coupled only to the common contact.

2. The semiconductor device according to claim 1, further comprising:
   a plurality of antifuses; and
   control transistors mounted in each of the antifuses to control the writing in the antifuse,
   wherein the second diffusion layer, the gate wiring, and the common contact are respectively mounted in each of the antifuses.

3. The semiconductor device according to claim 2, further comprising:
   an antifuse forming region including the antifuses,
   wherein only the antifuses, the second diffusion layer, the gate wiring, and the common contacts are formed in the antifuse forming region in the substrate, and
   wherein the multiple control transistors are formed in a control transistor forming region that is a region separate from the antifuse forming region.

4. The semiconductor device according to claims 1,
   wherein the device isolation film isolates the second diffusion layer forming region including the second diffusion layer from the other devices, and contains a dummy gate insulation film formed over a second diffusion layer forming region, and
   wherein after being formed through the device isolation film, the gate wiring extends by way of the dummy gate insulation film over the substrate at a position on the second diffusion layer forming region.

5. The semiconductor device according to claim 4,
   wherein, the dummy gate insulation film is thicker than the gate insulation film.

6. The semiconductor device according to claim 5, further comprising control transistors to control writing in the antifuse,
   wherein the dummy gate insulation film is the same film thickness as the gate insulation film of the control transistor.

7. The semiconductor device according to claim 4,
   wherein the gate wiring is formed from semiconductor, and moreover at least the section positioned over the dummy gate insulation film is a conduction type opposite the conduction of the second diffusion layer.

8. The semiconductor device according to claim 1,
   wherein the device isolation film isolates the second diffusion layer forming region including the second diffusion layer from the other devices,
   wherein the device isolation film is positioned between the gate wiring and the second diffusion layer as seen from a plan view, and
   wherein the common contact is in contact with the gate wiring, the device isolation film, and the second diffusion layer.

9. The semiconductor device according to claim 8, further comprising:
- an etching stopper film formed over the device isolation film, the second diffusion layer, and the gate wiring; and
- an interlayer dielectric film formed over the etching stopper film,
- wherein the common contact passes through the interlayer dielectric film and the etching stopper film.

10. The semiconductor device according to claim 1, further comprising a dummy gate insulation film formed adjacent to the second diffusion layer and below the gate wiring,
- wherein when the antifuse is written to, a portion of the gate insulation film is destroyed and the dummy gate insulation film is not destroyed.

* * * * *